United States Patent
Xu (10) Patent No.: US 9,721,510 B2
(45) Date of Patent: Aug. 1, 2017

(54) GATE DRIVING UNIT FOR OUTPUTTING GATE DRIVING SIGNALS OF TWO ROWS OF PIXEL UNITS, GATE DRIVING CIRCUIT THEREOF, AND DISPLAY DEVICE THEREOF

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventor: Xiangyang Xu, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 149 days.

(21) Appl. No.: 14/422,219

(22) PCT Filed: Jun. 30, 2014

(86) PCT No.: PCT/CN2014/081116
§ 371 (c)(1),
(2) Date: Feb. 18, 2015

(87) PCT Pub. No.: WO2015/032238
PCT Pub. Date: Mar. 12, 2015

(65) Prior Publication Data
US 2016/0012764 A1 Jan. 14, 2016

(30) Foreign Application Priority Data

Sep. 6, 2013 (CN) .......................... 2013 1 0403679

(51) Int. Cl.
*G09G 3/36* (2006.01)
*G09G 3/32* (2016.01)
(Continued)

(52) U.S. Cl.
CPC ......... *G09G 3/3266* (2013.01); *G09G 3/3677* (2013.01); *G11C 19/28* (2013.01);
(Continued)

(58) Field of Classification Search
CPC .... G11C 19/28; G09G 3/3266; G09G 3/3674; G09G 3/3677; G09G 2310/0286; G09G 2310/026
See application file for complete search history.

(56) References Cited

U.S. PATENT DOCUMENTS 9,030,399 B2 * 5/2015 Tseng ................. G09G 3/20
345/100
2006/0284815 A1 * 12/2006 Kwon .................. G09G 3/3614
345/98
(Continued)

FOREIGN PATENT DOCUMENTS

CN 201315145 Y 9/2009
CN 102945651 A 2/2013
(Continued)

OTHER PUBLICATIONS

Notification of the First Office Action dated Jan. 30, 2015 corresponding to Chinese application No. 201310403679.4.
(Continued)

*Primary Examiner* — Chanh Nguyen
*Assistant Examiner* — Navin Lingaraju
(74) *Attorney, Agent, or Firm* — Nath, Goldberg & Meyer; Joshua B. Goldberg; Christopher Thomas (57) ABSTRACT

A gate driving unit includes an input circuit, a pull-up circuit, a reset circuit, and an output circuit. The pull-up
(Continued)

driving signals received by the input circuit include the gate driving signals for pixel units of row n−2 and row n+4. The reset driving signals received by the reset circuit include the gate driving signals for pixel units of row n+2 and row n+8. The gate driving signals output from the output circuit include the gate driving signals for pixel units of row n and row n+6. Where, n is a positive integer and n∈[3,∞). The gate driving unit can output gate driving signals of two rows of pixel units and thus has a high service efficiency. An area occupied by a gate driving circuit made of the gate driving units is reduced, and a driving efficiency of the gate driving circuit is increased.

15 Claims, 3 Drawing Sheets

(51) Int. Cl.
  *G11C 19/28* (2006.01)
  *G09G 3/3266* (2016.01)
(52) U.S. Cl.
  CPC ......... *G09G 2310/021* (2013.01); *G09G 2310/0218* (2013.01); *G09G 2310/0248* (2013.01); *G09G 2310/0267* (2013.01); *G09G 2310/0286* (2013.01); *G09G 2310/08* (2013.01)

(56) References Cited

U.S. PATENT DOCUMENTS

| | | | | |
|---|---|---|---|---|
| 2008/0143759 A1* | 6/2008 | Chien | ............... | G09G 3/3674 345/698 |
| 2008/0266477 A1* | 10/2008 | Lee | ............... | G09G 3/3677 349/46 |
| 2008/0309597 A1* | 12/2008 | Nam | ............... | G09G 3/3677 345/87 |
| 2009/0167668 A1 | 7/2009 | Kim | | |
| 2010/0156869 A1 | 6/2010 | Lee et al. | | |
| 2011/0002437 A1* | 1/2011 | Su | ............... | G11C 19/28 377/64 |
| 2011/0058642 A1* | 3/2011 | Tsai | ............... | G09G 3/3677 377/79 |
| 2011/0199354 A1* | 8/2011 | Iwase | ............... | G09G 3/3677 345/208 |
| 2011/0316833 A1* | 12/2011 | Chang | ............... | G09G 3/3677 345/211 |
| 2012/0008731 A1* | 1/2012 | Hsu | ............... | G11C 19/28 377/79 |
| 2012/0113068 A1* | 5/2012 | Chen | ............... | G11C 19/28 345/204 |
| 2012/0162170 A1 | 6/2012 | Ochiai et al. | | |
| 2012/0182279 A1 | 7/2012 | Ochiai et al. | | |
| 2012/0212401 A1* | 8/2012 | Bae | ............... | G09G 3/3648 345/88 |
| 2013/0077736 A1* | 3/2013 | Son | ............... | G09G 3/20 377/69 |
| 2013/0135284 A1* | 5/2013 | Tseng | ............... | G11C 19/28 345/212 |
| 2014/0010341 A1* | 1/2014 | Wu | ............... | G11C 19/28 377/78 |
| 2014/0159997 A1* | 6/2014 | Chen | ............... | G09G 3/3611 345/87 |
| 2015/0185522 A1* | 7/2015 | Xu | ............... | G02F 1/13306 327/108 |
| 2015/0206495 A1* | 7/2015 | Xu | ............... | G09G 3/3677 345/213 |
| 2015/0269899 A1* | 9/2015 | Ma | ............... | G09G 3/20 345/213 |
| 2016/0027526 A1* | 1/2016 | Xu | ............... | G11C 19/28 345/215 |
| 2016/0240158 A1* | 8/2016 | Xu | ............... | G09G 3/3677 |

FOREIGN PATENT DOCUMENTS

| | | |
|---|---|---|
| CN | 102956269 A | 3/2013 |
| CN | 103035298 A | 4/2013 |
| CN | 103474040 A | 12/2013 |
| CN | 103500551 A | 1/2014 |
| TW | 200605015 | 2/2006 |

OTHER PUBLICATIONS

International Patent Application No. PCT/CN2014/081116, International Search Report dated Sep. 19, 2014, fourteen (14) pages.

\* cited by examiner

GATE DRIVING UNIT FOR OUTPUTTING GATE DRIVING SIGNALS OF TWO ROWS OF PIXEL UNITS, GATE DRIVING CIRCUIT THEREOF, AND DISPLAY DEVICE THEREOF

This is a National Phase Application filed under 35 U.S.C. 371 as a national stage of PCT/CN2014/081116, filed Jun. 30, 2014, and claims priority benefit from Chinese Application No. 201310403679.4, filed Sep. 6, 2013, the content of each of which is hereby incorporated by reference in its entirety.

FIELD OF THE INVENTION

The present invention relates to the field of display technology, and in particular, relates to a gate driving unit, a gate driving circuit, and a display device.

BACKGROUND OF THE INVENTION

Nowadays, a liquid crystal display (LCD) and an organic light-emitting diode (OLED) display device are still mainstream products of flat panel display. In a liquid crystal display and an active matrix OLED display device, thin film transistors (TFTs) are generally used for controlling respective pixel units to achieve image display. Control of pixel units includes control of rows and control of columns. The control of rows is generally achieved by using a gate driving circuit for scanning pixel units row by row, and the gate driving circuit (e.g., a Gate driver On Array (GOA)) has been well developed till now. The control of columns is generally achieved by using a data driving circuit for scanning pixel units column by column, thereby transmitting display data.

Figure 1:
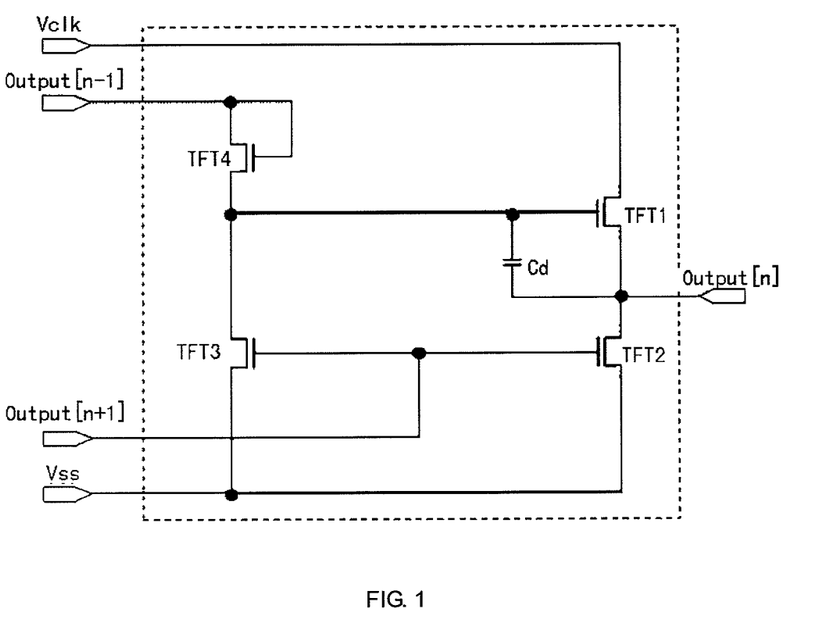
FIG. 1 is a circuit diagram of a gate driving unit in the prior art.
Figure 2:
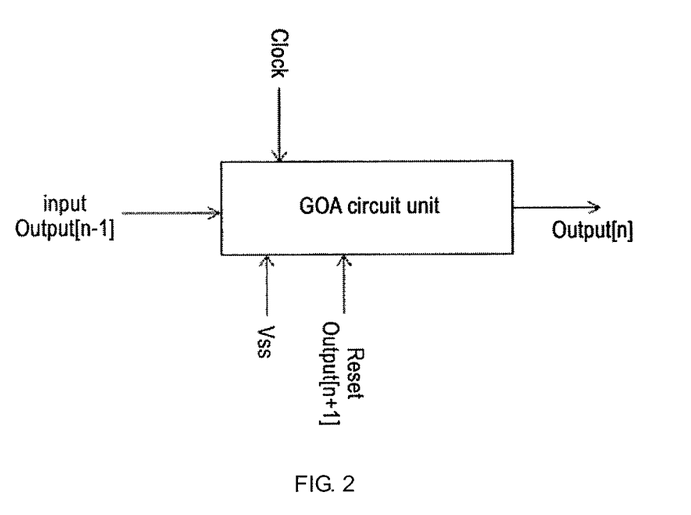
FIG. 2 is a schematic diagram showing circuit interfaces of a gate driving unit in FIG. 1.

A traditional gate driving circuit is composed of a plurality of gate driving units which are cascaded. Each of the gate driving units has a same structure of being composed of four thin film transistors and one capacitor (i.e., a structure of 4T1C). Each of the gate driving units has a same working process, except that an input signal and an output signal thereof are different. The circuit structure of a typical gate driving unit is shown in FIG. 1, and the circuit interfaces of the gate driving unit are shown in FIG. 2. Where, Vclk is a clock signal input terminal, Clock is a clock signal input from the clock signal input terminal, Vss is a low potential signal input terminal, and Output[n−1], Output[n], and Output[n+1] are gate driving signals of row n−1, row n, and row n+1 of pixel units, respectively. The working process of the gate driving unit is as follows. Firstly, the gate driving signal Output[n−1] of the row n−1 becomes a high level pulse signal, to turn on a thin film transistor TFT4 and charge a capacitor Cd, and to cause the gate of a thin film transistor TFT1 to be at a high potential so as to turn on the thin film transistor TFT1 at the same time. Next, the gate driving signal Output[n] of the row n becomes a high level pulse signal in synchronization with the clock signal Clock, to turn on pixel units of the row n. Then, the gate driving signal Output[n+1] of the row n+1 becomes a high level pulse signal, to turn on a thin film transistor TFT2 and a thin film transistor TFT3, thereby the capacitor Cd and the gate driving signal Output[n] of the row n being pulled down by a low potential signal input from the low potential signal input terminal Vss. Thus, the thin film TFT1 is turned off and the gate driving signal Output[n] of the row n is maintained at a low potential, so that the pixel units of the row n are turned off.

Since the above gate driving circuit is composed of n gate driving units, the circuit connection thereof is complicated and an area of the whole gate driving circuit is large. Thus, an area occupied by the gate driving circuit on a substrate is also large, which hinders a display panel to have a small size and a low cost. With development of flat panel display technology, to have a narrow border, to be a thin type, and to have a low cost have been development trends of flat panel display. Especially, simplification of the gate driving circuit and reduction of an area of the gate driving circuit have been very important for a product of small size and high resolution.

SUMMARY OF THE INVENTION

In view of the above technical problems existing in the prior art, the present invention provides a gate driving unit, a gate driving circuit, and a display device. The gate driving unit is capable of outputting gate driving signals of two rows of pixel units and thus has a high service efficiency. In the case where the number of rows of gates of pixel units to be driven is the same, in a gate driving circuit made of the gate driving units, the number of the gate driving units can be reduced by half. Accordingly, an area occupied by the gate driving circuit is reduced, and a driving efficiency of the gate driving circuit is increased.

The present invention provides a gate driving unit including an input circuit, a pull-up circuit, a reset circuit, and an output circuit, the input circuit being connected to both the pull-up circuit and the reset circuit, the pull-up circuit and the reset circuit being connected to the output circuit, respectively, wherein the input circuit is used for receiving a pull-up driving signal and inputting the pull-up driving signal to the pull-up circuit;

the pull-up circuit is used for receiving the pull-up driving signal and outputting a high level signal to an input terminal of the output circuit;

the reset circuit is used for receiving a reset driving signal and resetting the high level signal at the input terminal of the output circuit to a low level signal; and the output circuit is used for receiving an output signal from the pull-up circuit and an output signal from the reset circuit, and outputting a gate driving signal under control of a clock signal;

wherein, the pull-up driving signals received by the input circuit include the gate driving signals for pixel units of row n−2 and row n+4, the reset driving signals received by the reset circuit include the gate driving signals for pixel units of row n+2 and row n+8, and the gate driving signals output from the output circuit include the gate driving signals for pixel units of row n and row n+6, where n is a positive integer and n∈[3, ∞).

Preferably, the input circuit includes a first transistor, a second transistor, and a fifth transistor, gates of the first transistor and the second transistor are respectively connected to respective sources thereof, drains of the first transistor and the second transistor are connected to both a gate and a drain of the fifth transistor, a source of the fifth transistor is connected to both the pull-up circuit and the reset circuit, the gate driving signal of the pixel units of the row n−2 is input to the gate of the first transistor, and the gate driving signal of the pixel units of the row n+4 is input to the gate of the second transistor;

the pull-up circuit includes a sixth transistor and a capacitor connected between a gate and a source of the sixth transistor, the gate of the sixth transistor is further connected to the source of the fifth transistor in the input circuit, a drain of the sixth transistor is connected to a high potential terminal, and the source of the sixth transistor is further connected to the input terminal of the output circuit;

the reset circuit includes a third transistor, a fourth transistor, a seventh transistor, and an eighth transistor, gates of the third transistor and the fourth transistor are respectively connected to respective sources thereof, drains of the third transistor and the fourth transistor are connected to gates of both the seventh transistor and the eighth transistor, the gate of the seventh transistor is connected to the gate of the eighth transistor, a source of the seventh transistor is connected to the source of the fifth transistor in the input circuit, a source of the eighth transistor is connected to the source of the sixth transistor in the pull-up circuit, drains of the seventh transistor and the eighth transistor are connected to a low potential terminal, the gate driving signal of the pixel units of the row n+2 is input to the gate of the third transistor, and the gate driving signal of the pixel units of the row n+8 is input to the gate of the fourth transistor; and the output circuit includes a ninth transistor, a tenth transistor, an eleventh transistor, and a twelfth transistor, a gate of the eleventh transistor is connected to a first clock signal or a second clock signal, a gate of the twelfth transistor is connected to a third clock signal or a fourth clock signal, sources of the eleventh transistor and the twelfth transistor are connected to the source of the sixth transistor in the pull-up circuit, gates of the ninth transistor and the tenth transistor are connected to the gate of the seventh transistor in the reset circuit, a drain of the eleventh transistor is connected to a source of the ninth transistor and outputs the gate driving signal of the pixel units of the row n, a drain of the twelfth transistor is connected to a source of the tenth transistor and outputs the gate driving signal of the pixel units of the row n+6, and drains of the ninth transistor and the tenth transistor are connected to the low potential terminal.

Preferably, the first clock signal, the second clock signal, the third clock signal, and the fourth clock signal have a same pulse width and a duty ratio of 1/2, the first clock signal is 1/2 cycle ahead of the third clock signal, and the second clock signal is 1/2 cycle ahead of the fourth clock signal.

Preferably, a gate driving signal of pixel units of row 1 or row 2 received by the input circuit is a 1/2 frame start signal.

Preferably, the gate driving signals of pixel units of two adjacent odd-numbered rows or two adjacent even-numbered rows have an interval of 1/2 cycle therebetween.

Preferably, the gate driving unit causes the pull-up circuit to be precharged through inputting the gate driving signals of pixel units of the row n−2 and the row n+4 by the input circuit;

the pull-up circuit is capable of outputting a high level signal after the precharge is finished, and under control of the first clock signal to the fourth clock signal, the high level signal causes the output circuit to output the gate driving signals of pixel units of the row n and the row n+6; and the gate driving unit resets the output gate driving signals of pixel units of the row n and the row n+6 from a high level signal to a low level signal through inputting the gate driving signals of pixel units of the row n+2 and the row n+8 by the reset circuit.

The present invention further provides a gate driving circuit including a plurality of the gate driving units as described above, wherein the plurality of gate driving units are cascaded sequentially.

Preferably, respective clock signals used by two adjacent ones among the plurality of gate driving units have an interval of 1/4 cycle therebetween.

Preferably, the gate driving circuit includes two 1/2 frame start signals and two 1/2 frame reset signals, the two 1/2 frame start signals serve as pull-up driving signals for the gate driving signals of pixel units of row 1 and row 2, respectively, the two 1/2 frame reset signals serve as reset driving signals for the gate driving signals of pixel units of last two rows, respectively, an interval between the two 1/2 frame start signals is 1/4 cycle of the clock signal, and an interval between the two 1/2 frame reset signals is 1/4 cycle of the clock signal.

The present invention further provides a display device including the gate driving circuit as described above.

The advantageous technical effects of the present invention are as follows. As compared with a gate driving unit which can output only a gate driving signal of one row of pixel units in the prior art, the gate driving unit provided by the present invention has a higher efficiency by inputting gate driving signals of two rows of pixel units to the input terminals of the input circuit and the input terminals of the reset circuit, and outputting gate driving signals of two rows of pixel units from the output terminals of the output circuit. In the gate driving circuit provided by the present invention, an area occupied by the whole gate driving circuit is reduced due to that the number of the gate driving units is reduced. In addition, since gate driving signals of two adjacent rows of pixel units which are out put by two adjacent gate driving units have an interval of 1/4 cycle, a charge time is reduced and a charge efficiency is increased. Thus, a driving efficiency of the whole gate driving circuit is increased.

DESCRIPTION OF REFERENCE SIGNS

1. Input circuit;
2. Pull-up circuit;
3. Reset circuit; and
4. Output circuit.

DETAILED DESCRIPTION OF THE EMBODIMENTS

For better understanding the technical solutions of the present invention by a person skilled in the art, a gate driving unit, a gate driving circuit, and a display device according to the present invention will be described in detail with reference to the drawings and the following embodiments.

Embodiment 1

Figure 3:
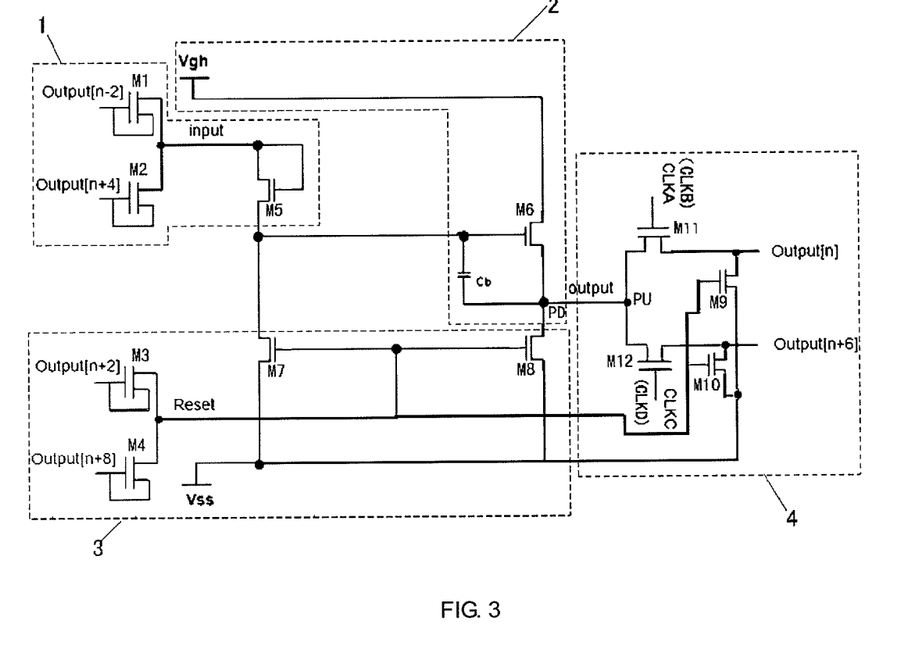
FIG. 3 is a circuit diagram of a gate driving unit according to Embodiment 1 of the present invention.

The present embodiment provides a gate driving unit, as shown in FIG. 3. The gate driving unit includes an input circuit 1, a pull-up circuit 2, a reset circuit 3, and an output circuit 4. The input circuit 1 is connected to both the pull-up circuit 2 and the reset circuit 3, and the pull-up circuit 2 and the reset circuit 3 are connected to the output circuit 4, respectively. Wherein, the input circuit 1 is used for receiving a pull-up driving signal and inputting the pull-up driving signal to the pull-up circuit 2;

the pull-up circuit 2 is used for receiving the pull-up driving signal and outputting a high level signal to an input terminal PU of the output circuit 4;

the reset circuit 3 is used for receiving a reset driving signal and resetting the high level signal at the input terminal PU of the output circuit 4 to a low level signal; and the output circuit 4 is used for receiving an output signal from the pull-up circuit 2 and an output signal from the reset circuit 3, and outputting a gate driving signal under control of a clock signal.

In the present embodiment, the pull-up driving signals received by the input circuit 1 include the gate driving signals for pixel units of row n−2 and row n+4. The reset driving signal received by the reset circuit 3 includes the gate driving signals for pixel units of row n+2 and row n+8. The gate driving signals output from the output circuit 4 include the gate driving signals for pixel units of row n and row n+6. Where, n is a positive integer and n∈[3,∞).

As shown in FIG. 3, a detailed circuit of the gate driving unit is as follows.

The input circuit 1 includes a first transistor M1, a second transistor M2, and a fifth transistor M5. Gates of the first transistor M1 and the second transistor M2 are respectively connected to respective sources thereof, and drains of the first transistor M1 and the second transistor M2 are connected to both a gate and a drain of the fifth transistor M5. A source of the fifth transistor M5 is connected to both the pull-up circuit 2 and the reset circuit 3. The gate driving signal of the pixel units of the row n−2 is input to the gate of the first transistor M1, and the gate driving signal of the pixel units of the row n+4 is input to the gate of the second transistor M2.

The pull-up circuit 2 includes a sixth transistor M6 and a capacitor Cb connected between a gate and a source of the sixth transistor M6. The gate of the sixth transistor M6 is further connected to the source of the fifth transistor M5 in the input circuit 1. A drain of the sixth transistor M6 is connected to a high potential terminal Vgh, and the source of the sixth transistor M6 is further connected to the input terminal PU of the output circuit 4.

The reset circuit 3 includes a third transistor M3, a fourth transistor M4, a seventh transistor M7, and an eighth transistor M8. Gates of the third transistor M3 and the fourth transistor M4 are respectively connected to respective sources thereof, and drains of the third transistor M3 and the fourth transistor M4 are connected to gates of both the seventh transistor M7 and the eighth transistor M8. The gate of the seventh transistor M7 is connected to the gate of the eighth transistor M8, and a source of the seventh transistor M7 is connected to the source of the fifth transistor M5 in the input circuit 1. A source of the eighth transistor M8 is connected to the source of the sixth transistor M6 in the pull-up circuit 2, and drains of the seventh transistor M7 and the eighth transistor M8 are connected to a low potential terminal Vss. The gate driving signal of the pixel units of the row n+2 is input to the gate of the third transistor M3, and the gate driving signal of the pixel units of the row n+8 is input to the gate of the fourth transistor M4.

The output circuit 4 includes a ninth transistor M9, a tenth transistor M10, an eleventh transistor M11, and a twelfth transistor M12. A gate of the eleventh transistor M11 is connected to a first clock signal CLKA or a second clock signal CLKB, and a gate of the twelfth transistor M12 is connected to a third clock signal CLKC or a fourth clock signal CLKD. Sources of the eleventh transistor M11 and the twelfth transistor M12 are connected to the source of the sixth transistor M6 in the pull-up circuit 2, and gates of the ninth transistor M9 and the tenth transistor M10 are connected to the gate of the seventh transistor M7 in the reset circuit 3. A drain of the eleventh transistor M11 is connected to a source of the ninth transistor M9, and outputs the gate driving signal of the pixel units of the row n. A drain of the twelfth transistor M12 is connected to a source of the tenth transistor M10, and outputs the gate driving signal of the pixel units of the row n+6. Drains of the ninth transistor M9 and the tenth transistor M10 are connected to the low potential terminal Vss.

Wherein, two adjacent gate driving units respectively use two clock signals which have an interval of 1/2 cycle therebetween. That is, one of the two adjacent gate driving units uses two clock signals which have an interval of 1/2 cycle therebetween, another of the two adjacent gate driving units uses two clock signals which also have an interval of 1/2 cycle therebetween. For example, if one gate driving unit uses the first clock signal CLKA and the third clock signal CLKC and another gate driving unit adjacent to the one gate driving unit uses the second clock signal CLKB and the fourth clock signal CLKD, the first clock signal CLKA and the third clock signal CLKC are two clock signals which have an interval of 1/2 cycle therebetween and the second clock signal CLKB and the fourth clock signal CLKD are two clock signals which have an interval of 1/2 cycle therebetween.

It should be noted that, preferably, the first transistor M1, the second transistor M2, the third transistor M3, the fourth transistor M4, the fifth transistor M5, the sixth transistor M6, the seventh transistor M7, the eighth transistor M8, the ninth transistor M9, the tenth transistor M10, the eleventh transistor M11, and the twelfth transistor M12 are all thin film transistors. Of course, other types of transistors with gating switch function may also be used. When the gate of a thin film transistor is turned on and a voltage difference between the source and the drain of the thin film transistor meets a turn-on condition, the thin film transistor is turned on. Wherein, the source of the thin film transistor is a signal input terminal of the thin film transistor and the drain of the thin film transistor is a signal output terminal of the thin film transistor, or vice versa. Specifically, when a voltage at the source of the thin film transistor is high, electric current flows from the source to the drain; and when a voltage at the drain of the thin film transistor is high, electric current flows from the drain to the source. That is, the source and the drain can be interchanged.

In the present embodiment, the first clock signal CLKA, the second clock signal CLKB, the third clock signal CLKC, and the fourth clock signal CLKD have a same pulse width and a duty ratio of 1/2. The first clock signal CLKA is 1/2 cycle ahead of the third clock signal CLKC, and the second clock signal CLKB is 1/2 cycle ahead of the fourth clock signal CLKD. Wherein, a gate driving signal (a pull-up driving signal) of pixel units of row 1 or row 2 received by the input circuit 1 is a 1/2 frame start signal, to serve as an initial triggering signal. The gate driving signals of pixel units of two adjacent odd-numbered rows or two adjacent even-numbered rows have an interval of 1/2 cycle therebetween. With such a configuration, it can be ensured that the pixel units of adjacent odd-numbered rows or adjacent even-numbered rows can output gate driving signals row by row.

Figure 4:
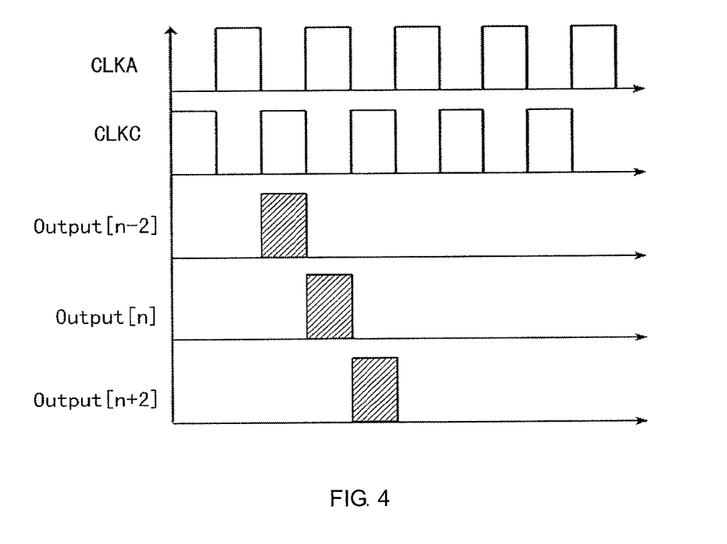
FIG. 4 is a driving timing diagram of the gate driving unit according to Embodiment 1 of the present invention.

The present embodiment further provides a gate driving method based on the above gate driving unit. A detailed driving process of the gate driving unit will be described below by taking a gate driving unit which uses the first clock signal CLKA and the third clock signal CLKC as an example. A drive timing of the gate driving method is shown in FIG. 4. Specifically, the gate driving method includes the following steps, wherein, a working process of the gate driving unit is described by taking the case where the gate driving signal of the pixel units of the row n−2 is input as an example.

S1: inputting the gate driving signal of the pixel units of the row n−2 by the input circuit 1 as a pull-up driving signal, so that the pull-up circuit 2 is precharged.

The step S1 is a first stage of a gate driving process. When former 1/2 cycle of the first clock signal CLKA is a low level signal and former 1/2 cycle of the third clock signal CLKC is a high level signal, the input circuit 1 inputs the gate driving signal of the pixel units of the row n−2, and the gate driving signal of the pixel units of the row n−2 is a high level pulse signal. The gate driving signal of the pixel units of the row n−2 serves as a pull-up driving signal, which precharges the capacitor Cb through the fifth transistor M5.

Wherein, if the input circuit 1 inputs the gate driving signal of the pixel units of the row 1 or the row 2, the input gate driving signal is an initial triggering signal which has the same magnitude and the same cycle as those of the above high level pulse signal. The initial triggering signal is provided by an external triggering circuit, and a driving process of the gate driving unit is started by the initial triggering signal.

S2: outputting a high level signal by the pull-up circuit 2 after its precharge is finished, so that the high level signal, under control of the first clock signal CLKA and the third clock signal CLKC, causes the output circuit 4 to output the gate driving signal of the pixel units of the row n.

In the step S1, during the former 1/2 cycle of the first clock signal CLKA, the gate driving signal of the pixel units of the row n−2 serves as a precharge voltage signal of the gate driving signal of the pixel units of the row n, to precharge the capacitor Cb. At the time when the former 1/2 cycle of the first clock signal CLKA ends, the precharge of the capacitor Cb is finished, i.e., the precharge of the pull-up circuit 2 is finished, so that the gate of the sixth transistor M6 in the pull-up circuit 2 is at a high potential.

The step S2 is a second stage of the gate driving process. At a start time of latter 1/2 cycle of the first clock signal CLKA, the first clock signal CLKA changes to a high level signal, and the third clock signal CLKC changes to a low level signal. An output terminal PD of the pull-up circuit 2 outputs a high level signal under the pull-up of the high potential terminal Vgh. This high level signal, under control of the first clock signal CLKA, causes the output circuit 4 to output the gate driving signal Output[n] of the pixel units of the row n, wherein the gate driving signal Output[n] is a high level pulse signal and serves to turn on the pixel units of the row n. At the same time, the gate driving signal of the pixel units of the row n also serves as a precharge voltage signal of the gate driving signal of the pixel units of the row n+2, and serves as a reset driving signal of the gate driving signal of the pixel units of the row n−2, i.e., serves to reset the gate driving signal of the pixel units of the row n−2.

S3: inputting the gate driving signal of the pixel units of the row n+2 by the reset circuit 3 as a reset driving signal, so that the output gate driving signal of the pixel units of the row n is reset from a high level signal to a low level signal.

The step S3 is a third stage of the gate driving process. During former 1/2 cycle of a next cycle of the first clock signal CLKA, the gate driving signal of the pixel units of the row n serves as a precharge voltage signal of the gate driving signal of the pixel units of the row n+2, to precharge the capacitor Cb. At the same time, the gate driving signal of the pixel units of the row n+2 resets the gate driving signal of the pixel units of the row n. Specifically, during the former 1/2 cycle of the next cycle of the first clock signal CLKA, the first clock signal CLKA changes to a low level signal, and the third clock signal CLKC changes to a high level signal. The reset circuit 3 inputs the gate driving signal Output[n+2] of the pixel units of the row n+2. The gate driving signal of the pixel units of the row n+2 is a high level pulse signal, and causes the seventh transistor M7 and the eighth transistor M8 to turn on. Under the pull-down of the low potential terminal Vss, high level signals output from two pole plates of the capacitor Cb and the output terminal PD of the pull-up circuit 2 are pulled down, and the sixth transistor M6 is turned off. Furthermore, the gate driving signal of the pixel units of the row n+2 causes the ninth transistor M9 to turn on, so that the gate driving signal Output[n] of the pixel units of the row n is pulled down and maintained at a low potential by the low potential terminal Vss. That is, the gate driving signal of the pixel units of the row n is reset to a low level signal.

So far, the gate driving unit has finished the output and the reset of the gate driving signal of the pixel units of the row n.

Similarly, the output and the reset of the gate driving signal Output[n+6] of the pixel units of the row n+6 are performed according to the above driving method under the cooperation of the gate driving signal Output[n+4] of the pixel units of the row n+4 (a pull-up driving signal), the gate driving signal Output[n+8] of the pixel units of the row n+8 (a reset driving signal), the first clock signal CLKA, and the third clock signal CLKC.

The gate driving unit according to the present embodiment has a higher efficiency by respectively inputting gate driving signals of two rows of pixel units to the input terminals of the input circuit 1 and the input terminals of the reset circuit 3, and outputting the gate driving signals of two rows of pixel units from the output terminals of the output circuit 4. In the case where the number of rows of gates of pixel units to be driven is same, in a gate driving circuit made of the gate driving unit, the number of the gate driving units can be reduced by half. Accordingly, an area occupied by the gate driving circuit is reduced.

Embodiment 2

Figure 5:
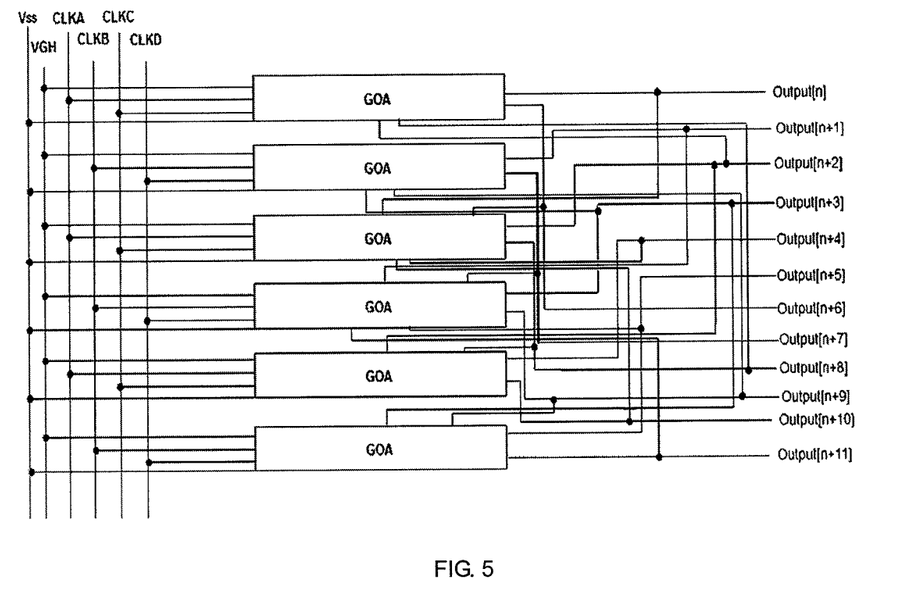
FIG. 5 is a circuit diagram of a gate driving circuit according to Embodiment 2 of the present invention.

The present embodiment provides a gate driving circuit including the above gate driving units GOA, as shown in FIG. 5. The gate driving circuit includes a plurality of the gate driving units GOA which are cascaded sequentially. The plurality of the gate driving units GOA alternately use the first clock signal CLKA and the third clock signal CLKC, and the second clock signal CLKB and the fourth clock signal CLKD sequentially and cyclically. That is, one of the two adjacent gate driving units uses the first clock signal CLKA and the third clock signal CLKC, the other of the two adjacent gate driving units uses the second clock signal CLKB and the fourth clock signal CLKD.

In the present embodiment, every two adjacent ones of the four clock signals used by the two adjacent gate driving units GOA have an interval of 1/4 cycle therebetween. That is, the first clock signal CLKA and the second clock signal CLKB have an interval of 1/4 cycle therebetween, the second clock signal CLKB and the third clock signal CLKC have an interval of 1/4 cycle therebetween, and the third clock signal CLKC and the fourth clock signal CLKD have an interval of 1/4 cycle therebetween. With such a configuration, a next gate driving unit can be precharged in advance to shorten a precharge time from a previous gate driving unit to a subsequent gate driving unit. Thus, a charge efficiency of the whole gate driving circuit is increased.

In the present embodiment, the gate driving circuit includes two 1/2 frame start signals and two 1/2 frame reset signals. Wherein, the "frame" is a time parameter when display is performed on a display screen. "1 frame" is a time period to scan from the first row of pixel units to the last row of pixel units, i.e., a time period to drive the whole screen once. Similarly, "1/2 frame" is a time period to drive a half of the screen, and the "1/2 frame start signal" means to send a signal at an interval of 1/2 frames. The two 1/2 frame start signals serve as pull-up driving signals for the gate driving signals of the pixel units of the row 1 and the row 2, respectively, and an interval between the two 1/2 frame start signals is 1/4 cycle of the clock signal. That is, in the gate driving circuit, a first odd-numbered gate driving unit and a first even-numbered gate driving unit (which generally correspond to a first gate driving unit and a second gate driving unit) in a drive order respectively require one initial triggering signal. These two initial triggering signals are the 1/2 frame start signals. In the drive order, odd-numbered gate driving units drive gates of pixel units of odd-numbered rows, respectively, and even-numbered gate driving units drive gates of pixel units of even-numbered rows, respectively. The "1/2 frame reset signal" means to send a reset signal at an interval of 1/2 frames. The two 1/2 frame reset signals serve as reset driving signals for the gate driving signals of pixel units of the last two rows, respectively, and an interval between the two 1/2 frame reset signals is 1/4 cycle of the clock signal.

Figure 6:
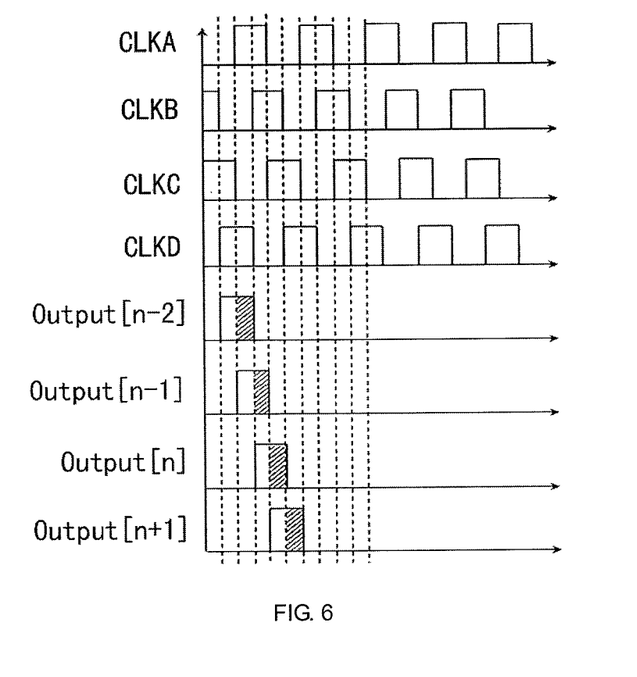
FIG. 6 is a driving timing diagram of the gate driving circuit according to Embodiment 2 of the present invention.

Referring to the driving timing diagram of a gate driving circuit shown in FIG. 6, the working process of four gate driving units which are cascaded sequentially is taken as an example. The four gate driving units are a first gate driving unit, a second gate driving unit, a third gate driving unit, and a fourth gate driving unit, and sequentially output the gate driving signals of the pixel units of the row n−2, the row n−1, the row n, and the row n+1 under cooperation of the first clock signal CLKA, the second clock signal CLKB, the third clock signal CLKC, and the fourth clock signal CLKD.

Specifically, the driving process of the above gate driving circuit is as follows.

A First Stage:

When a first 1/4 cycle of the first clock signal CLKA is a low level signal, a first pull-up driving signal is provided to the gate driving signal of the pixel units of the row n−2 by the input circuit of the first gate driving unit, and this first pull-up driving signal precharges the gate driving signal of the pixel units of the row n−2. At a time when the first 1/4 cycle ends, the first clock signal CLKA changes to a high level signal, and the output circuit of the first gate driving unit outputs the gate driving signal Output[n−2] of the pixel units of the row n−2. The gate driving signal Output[n−2] of the pixel units of the row n−2 is a high level signal.

A Second Stage:

At the time when the output circuit of the first gate driving unit outputs the gate driving signal Output[n−2] of the pixel units of the row n−2, i.e, at a time when a second 1/4 cycle immediately next to the first 1/4 cycle starts, the second clock signal CLKB is a low level signal, and a second pull-up driving signal is provided to the gate driving signal of the pixel units of the row n−1 by the input circuit of the second gate driving unit. The second pull-up driving signal precharges the gate driving signal of the pixel units of the row n−1. At a time when the second 1/4 cycle ends, the second clock signal CLKB changes to a high level signal, and the output circuit of the second gate driving unit outputs the gate driving signal Output[n−1] of the pixel units of the row n−1. The gate driving signal Output[n−1] of the pixel units of the row n−1 is a high level signal.

A Third Stage:

At the time when the output circuit of the second gate driving unit outputs the gate driving signal Output[n−1] of the pixel units of the row n−1, i.e, at a time when a third 1/4 cycle immediately next to the second 1/4 cycle starts, the third clock signal CLKC is a low level signal, and a third pull-up driving signal is provided to the gate driving signal of the pixel units of the row n by the gate driving signal Output[n−2] of the pixel units of the row n−2. The third pull-up driving signal precharges the gate driving signal of the pixel units of the row n. When the precharge is finished, the gate driving signal of the pixel units of the row n−2 is reset to a low level signal. At a time when the third 1/4 cycle ends, the third clock signal CLKC changes to a high level signal, and the output circuit of the third gate driving unit outputs the gate driving signal Output[n] of the pixel units of the row n. The gate driving signal Output[n] of the pixel units of the row n is a high level signal.

A Fourth Stage:

At the time when the output circuit of the third gate driving unit outputs the gate driving signal Output[n] of the pixel units of the row n, i.e, at a time when a fourth 1/4 cycle immediately next to the third 1/4 cycle starts, the fourth clock signal CLKD is a low level signal, and a fourth pull-up driving signal is provided to the gate driving signal of the pixel units of the row n+1 by the gate driving signal Output[n−1] of the pixel units of the row n−1. The fourth pull-up driving signal precharges the gate driving signal of the pixel units of the row n+1. When the precharge is finished, the gate driving signal of the pixel units of the row n−1 is reset to a low level signal. At a time when the fourth 1/4 cycle ends, the fourth clock signal CLKD changes to a high level signal, and the output circuit of the fourth gate driving unit outputs the gate driving signal Output[n+1] of the pixel units of the row n+1. The gate driving signal Output[n+1] of the pixel units of the row n+1 is a high level signal.

Wherein, every two adjacent ones of the first pull-up driving signal, the second pull-up driving signal, the third pull-up driving signal, and the fourth pull-up driving signal have an interval of 1/4 cycle of the first clock signal CLKA.

The whole gate driving circuit cyclically performs a drive according to the above driving process from the first stage to the fourth stage, and thus the drive of the whole gate driving circuit is realized.

As shown in FIG. 6, the gate driving signals of the pixel units of the row n−2 to the row n+1, which are respectively output by the output circuits of the first to fourth gate driving units, are four pulse signals of which every two adjacent ones have an interval of 1/4 cycle of the first clock signal CLKA. The shaded portions of the four pulse signals correspond to 1/4 cycles of the first clock signal CLKA, the second clock signal CLKB, the third clock signal CLKC, and the fourth clock signal CLKD, respectively; and correspond to high level signal stages of the four clock signals, respectively. That is, only in pulse time periods of gate driving signals corresponding to the shaded portions, the first to fourth gate driving units respectively output the gate driving signals of the pixel units of the row n−2 to the row n+1, i.e., gate lines corresponding to gates of the pixel units of the row n−2 to the row n+1 refresh once. Furthermore, the blank portions of the four pulse signals also correspond to 1/4 cycles of the first clock signal CLKA, the second clock signal CLKB, the third clock signal CLKC, and the fourth clock signal CLKD, respectively; and correspond to low level signal stages of the four clock signals, respectively. Each of the blank portions represents a precharge time the gate driving signal of an immediately next row of pixel units relative to the gate driving signal of a previous row of pixel units. That is, in pulse time periods corresponding to the blank portions of the four pulse signals, the first to fourth gate driving units will not output the gate driving signals of the pixel units of the row n−2 to the row n+1, respectively. It can be seen that, a crosstalk will not occur between gate driving signals of any two adjacent rows of pixel units in the whole gate driving circuit. At the same time, since both precharge times of the gate driving signals (corresponding to the blank portions of the gate driving signals) and output times of the gate driving signals (corresponding to the shaded portions of the gate driving signals) of two adjacent rows of pixel units have an interval of 1/4 cycle, as compared with a traditional gate driving circuit in which output times of the gate driving signals of two adjacent rows of pixel units have an interval of 1/2 cycle, the charge time herein is reduced and the charge efficiency herein is increased. Thus, the driving efficiency of the whole gate driving circuit herein is increased.

It should be noted that, if the pixel units of the row n−2 are the pixel units of the row 1 and the pixel units of the row n−1 are the pixel units of the row 2, both the first pull-up driving signal and the second pull-up driving signal are initial triggering signals which are provided by an external triggering circuit. The initial triggering signal of the pixel units of the row 1 serves to initiate the drive of odd-numbered gate driving units, and the initial triggering signal of the pixel units of the row 2 serves to initiate the drive of even-numbered gate driving units. For the refresh of a frame of picture, two initial triggering signals have an interval of 1/2 frame start signal. Since two initial triggering signals have an interval of 1/4 cycle of the first clock signal, the refresh rate of a frame of picture is increased, thereby increasing the driving efficiency of the whole gate driving circuit. Further, if the pixel units of the row n+6 are the pixel units of the last row, the pixel units of the row n+5 are the pixel units of the last but one row, reset driving signals of the gate driving signals of these two rows of pixel units also need to be provided by an external triggering circuit. The reset driving signal for the gate driving signal of the pixel units of the row n+5 serves to initiate the reset of the last even-numbered gate driving unit, and the reset driving signal for the gate driving signal of the pixel units of the row n+6 serves to initiate the reset of the last odd-numbered gate driving unit. The reset driving signals for the gate driving signals of the last two rows of pixel units have an interval of 1/2 frame start signal, and have an interval of 1/4 cycle of the first clock signal.

Embodiment 3

The present embodiment provides a display device including the gate driving circuit according to Embodiment 2.

Since the above gate driving circuit is used, on one hand, an area occupied by the gate driving circuit on a display panel in the display device is reduced, and on the other hand, the refresh efficiency when the display device performs display is increased.

It should be understood that, the above embodiments are only exemplary embodiments for the purpose of explaining the principle of the present invention, and the present invention is not limited thereto. For a person having ordinary skill in the art, various improvements and modifications may be applied to the present invention without departing from the spirit and essence of the present invention. These improvements and modifications also fall within the protection scope of the present invention.

What is claimed is:

1. A gate driving unit including an input circuit, a pull-up circuit, a reset circuit, and an output circuit, the input circuit being directly connected to both the pull-up circuit and the reset circuit, the pull-up circuit and the reset circuit being directly connected to the output circuit, respectively, wherein
the input circuit, which comprises an input terminal and is used for receiving a pull-up driving signal and inputting the pull-up driving signal to the pull-up circuit;
the pull-up circuit is used for receiving the pull-up driving signal and outputting a high level signal to an input terminal of the output circuit;
the reset circuit, which comprises an input terminal and is used for receiving a reset driving signal and resetting the high level signal at the input terminal of the output circuit to a low level signal; and
the output circuit is used for receiving an output signal from the pull-up circuit and an output signal from the reset circuit, and outputting a gate driving signal under control of a clock signal;
wherein, the pull-up driving signals received by the input terminal of the input circuit include the gate driving signals for pixel units of row n−2 and row n+4, the reset driving signals received by the input terminal of the reset circuit include the gate driving signals for pixel units of row n+2 and row n+8, and the gate driving signals output from the output circuit include the gate driving signals for pixel units of row n and row n+6, where n is a positive integer and n is equal to or greater than 3.

2. The gate driving unit according to claim 1, wherein, the input circuit includes a first transistor, a second transistor, and a fifth transistor, gates of the first transistor and the second transistor are respectively connected to respective sources thereof, drains of the first transistor and the second transistor are connected to both a gate and a drain of the fifth transistor, a source of the fifth transistor is connected to both the pull-up circuit and the reset circuit, the gate driving signal of the pixel units of the row n−2 is input to the gate of the first transistor, and the gate driving signal of the pixel units of the row n+4 is input to the gate of the second transistor;
the pull-up circuit includes a sixth transistor and a capacitor connected between a gate and a source of the sixth transistor, the gate of the sixth transistor is further connected to the source of the fifth transistor in the input circuit, a drain of the sixth transistor is connected to a high potential terminal, and the source of the sixth transistor is further connected to the input terminal of the output circuit;

the reset circuit includes a third transistor, a fourth transistor, a seventh transistor, and an eighth transistor, gates of the third transistor and the fourth transistor are respectively connected to respective sources thereof, drains of the third transistor and the fourth transistor are connected to gates of both the seventh transistor and the eighth transistor, the gate of the seventh transistor is connected to the gate of the eighth transistor, a source of the seventh transistor is connected to the source of the fifth transistor in the input circuit, a source of the eighth transistor is connected to the source of the sixth transistor in the pull-up circuit, drains of the seventh transistor and the eighth transistor are connected to a low potential terminal, the gate driving signal of the pixel units of the row n+2 is input to the gate of the third transistor, and the gate driving signal of the pixel units of the row n+8 is input to the gate of the fourth transistor; and the output circuit includes a ninth transistor, a tenth transistor, an eleventh transistor, and a twelfth transistor, a gate of the eleventh transistor is connected to a first clock signal or a second clock signal, a gate of the twelfth transistor is connected to a third clock signal or a fourth clock signal, sources of the eleventh transistor and the twelfth transistor are connected to the source of the sixth transistor in the pull-up circuit, gates of the ninth transistor and the tenth transistor are connected to the gate of the seventh transistor in the reset circuit, a drain of the eleventh transistor is connected to a source of the ninth transistor and outputs the gate driving signal of the pixel units of the row n, a drain of the twelfth transistor is connected to a source of the tenth transistor and outputs the gate driving signal of the pixel units of the row n+6, and drains of the ninth transistor and the tenth transistor are connected to the low potential terminal.

3. The gate driving unit according to claim 2, wherein, the first clock signal, the second clock signal, the third clock signal, and the fourth clock signal have a same pulse width and a duty ratio of 1/2, the first clock signal is 1/2 cycle ahead of the third clock signal, and the second clock signal is 1/2 cycle ahead of the fourth clock signal.

4. The gate driving unit according to claim 3, wherein, a gate driving signal of pixel units of row 1 or row 2 received by the input circuit is a 1/2 frame start signal.

5. The gate driving unit according to claim 4, wherein, the gate driving signals of pixel units of two adjacent odd-numbered rows or two adjacent even-numbered rows have an interval of 1/2 cycle therebetween.

6. The gate driving unit according to claim 5, wherein, the gate driving unit causes the pull-up circuit to be precharged through inputting the gate driving signals of pixel units of the row n−2 and the row n+4 by the input circuit;

the pull-up circuit is capable of outputting a high level signal after the precharge is finished, and under control of the first clock signal to the fourth clock signal, the high level signal causes the output circuit to output the gate driving signals of pixel units of the row n and the row n+6; and the gate driving unit resets the output gate driving signals of pixel units of the row n and the row n+6 from a high level signal to a low level signal through inputting the gate driving signals of pixel units of the row n+2 and the row n+8 by the reset circuit.

7. A gate driving circuit including a plurality of gate driving units which are cascaded sequentially, each of the plurality of gate driving units including an input circuit, a pull-up circuit, a reset circuit, and an output circuit, the input circuit being directly connected to both the pull-up circuit and the reset circuit, the pull-up circuit and the reset circuit being directly connected to the output circuit, respectively, wherein the input circuit, which comprises an input terminal and is used for receiving a pull-up driving signal and inputting the pull-up driving signal to the pull-up circuit;

the pull-up circuit is used for receiving the pull-up driving signal and outputting a high level signal to an input terminal of the output circuit;

the reset circuit, which comprises an input terminal and is used for receiving a reset driving signal and resetting the high level signal at the input terminal of the output circuit to a low level signal; and the output circuit is used for receiving an output signal from the pull-up circuit and an output signal from the reset circuit, and outputting a gate driving signal under control of a clock signal;

wherein, the pull-up driving signals received by the input terminal of the input circuit include the gate driving signals for pixel units of row n−2 and row n+4, the reset driving signals received by the input terminal of the reset circuit include the gate driving signals for pixel units of row n+2 and row n+8, and the gate driving signals output from the output circuit include the gate driving signals for pixel units of row n and row n+6, where n is a positive integer and n is equal to or greater than 3.

8. The gate driving circuit according to claim 7, wherein, the input circuit includes a first transistor, a second transistor, and a fifth transistor, gates of the first transistor and the second transistor are respectively connected to respective sources thereof, drains of the first transistor and the second transistor are connected to both a gate and a drain of the fifth transistor, a source of the fifth transistor is connected to both the pull-up circuit and the reset circuit, the gate driving signal of the pixel units of the row n−2 is input to the gate of the first transistor, and the gate driving signal of the pixel units of the row n+4 is input to the gate of the second transistor;

the pull-up circuit includes a sixth transistor and a capacitor connected between a gate and a source of the sixth transistor, the gate of the sixth transistor is further connected to the source of the fifth transistor in the input circuit, a drain of the sixth transistor is connected to a high potential terminal, and the source of the sixth transistor is further connected to the input terminal of the output circuit;

the reset circuit includes a third transistor, a fourth transistor, a seventh transistor, and an eighth transistor, gates of the third transistor and the fourth transistor are respectively connected to respective sources thereof, drains of the third transistor and the fourth transistor are connected to gates of both the seventh transistor and the eighth transistor, the gate of the seventh transistor is connected to the gate of the eighth transistor, a source of the seventh transistor is connected to the source of the fifth transistor in the input circuit, a source of the eighth transistor is connected to the source of the sixth transistor in the pull-up circuit, drains of the seventh transistor and the eighth transistor are connected to a low potential terminal, the gate driving signal of the pixel units of the row n+2 is input to the gate of the third transistor, and the gate driving signal of the pixel units of the row n+8 is input to the gate of the fourth transistor; and the output circuit includes a ninth transistor, a tenth transistor, an eleventh transistor, and a twelfth transistor, a gate of the eleventh transistor is connected to a first clock signal or a second clock signal, a gate of the twelfth transistor is connected to a third clock signal or a fourth clock signal, sources of the eleventh transistor and the twelfth transistor are connected to the source of the sixth transistor in the pull-up circuit, gates of the ninth transistor and the tenth transistor are connected to the gate of the seventh transistor in the reset circuit, a drain of the eleventh transistor is connected to a source of the ninth transistor and outputs the gate driving signal of the pixel units of the row n, a drain of the twelfth transistor is connected to a source of the tenth transistor and outputs the gate driving signal of the pixel units of the row n+6, and drains of the ninth transistor and the tenth transistor are connected to the low potential terminal.

9. The gate driving circuit according to claim 8, wherein, the first clock signal, the second clock signal, the third clock signal, and the fourth clock signal have a same pulse width and a duty ratio of 1/2, the first clock signal is 1/2 cycle ahead of the third clock signal, and the second clock signal is 1/2 cycle ahead of the fourth clock signal.

10. The gate driving circuit according to claim 9, wherein, a gate driving signal of pixel units of row 1 or row 2 received by the input circuit is a 1/2 frame start signal.

11. The gate driving circuit according to claim 10, wherein, the gate driving signals of pixel units of two adjacent odd-numbered rows or two adjacent even-numbered rows have an interval of 1/2 cycle therebetween.

12. The gate driving circuit according to claim 11, wherein, the gate driving unit causes the pull-up circuit to be precharged through inputting the gate driving signals of pixel units of the row n−2 and the row n+4 by the input circuit;

the pull-up circuit is capable of outputting a high level signal after the precharge is finished, and under control of the first clock signal to the fourth clock signal, the high level signal causes the output circuit to output the gate driving signals of pixel units of the row n and the row n+6; and the gate driving unit resets the output gate driving signals of pixel units of the row n and the row n+6 from a high level signal to a low level signal through inputting the gate driving signals of pixel units of the row n+2 and the row n+8 by the reset circuit.

13. The gate driving circuit according to claim 7, wherein, respective clock signals used by two adjacent ones among the plurality of gate driving units have an interval of 1/4 cycle therebetween.

14. The gate driving circuit according to claim 13, wherein, the gate driving circuit includes two 1/2 frame start signals and two 1/2 frame reset signals, the two 1/2 frame start signals serve as pull-up driving signals for the gate driving signals of pixel units of row 1 and row 2, respectively, the two 1/2 frame reset signals serve as reset driving signals for the gate driving signals of pixel units of last two rows, respectively, an interval between the two 1/2 frame start signals is 1/4 cycle of the clock signal, and an interval between the two 1/2 frame reset signals is 1/4 cycle of the clock signal.

15. A display device including the gate driving circuit according to claim 7.

* * * * *